(12) United States Patent
Lee et al.

(10) Patent No.: US 9,102,851 B2
(45) Date of Patent: Aug. 11, 2015

(54) MICROCAVITY CARRIER BELT AND METHOD OF MANUFACTURE

(75) Inventors: Jiannrong Lee, Webster, NY (US); Yuhao Sun, Fremont, CA (US); Maung Kyaw Aung, Union City, CA (US); Chin-Jen Tseng, Fremont, CA (US); Chiapu Chang, Saratoga, CA (US); Shuji Rokutanda, Fremont, CA (US); Rong-Chang Liang, Cupertino, CA (US)

(73) Assignee: Trillion Science, Inc., Fremont, CA (US)

( * ) Notice: Subject to any disclaimer, the term of this patent is extended or adjusted under 35 U.S.C. 154(b) by 616 days.

(21) Appl. No.: 13/233,360

(22) Filed: Sep. 15, 2011

(65) Prior Publication Data

US 2013/0071636 A1 Mar. 21, 2013

(51) Int. Cl.
*B32B 5/16* (2006.01)
*B32B 3/10* (2006.01)
(Continued)

(52) U.S. Cl.
CPC ... *C09J 9/02* (2013.01); *B32B 3/10* (2013.01); *B32B 5/16* (2013.01); *B32B 7/12* (2013.01); *B32B 27/14* (2013.01); *B32B 27/281* (2013.01); *B32B 27/285* (2013.01); *B32B 27/286* (2013.01); *B32B 27/308* (2013.01); *B32B 27/36* (2013.01); *B32B 27/365* (2013.01); *B32B 37/14* (2013.01); *B32B 37/226* (2013.01); *B32B 38/10* (2013.01); *B65G 17/36* (2013.01); *C09J 7/00* (2013.01); *B32B 37/12* (2013.01); *B32B 38/06* (2013.01); *B32B 2255/10* (2013.01); *B32B 2255/26* (2013.01); *B32B 2264/105* (2013.01); *B32B 2266/045* (2013.01); *B32B 2307/202* (2013.01); *B32B 2309/08* (2013.01);
(Continued)

(58) Field of Classification Search
CPC .............................................. B65H 2301/4623
See application file for complete search history.

(56) References Cited

U.S. PATENT DOCUMENTS 4,247,234 A     1/1981   Hoffman
4,588,456 A *   5/1986   Dery et al. ...................... 156/52
(Continued)

FOREIGN PATENT DOCUMENTS

CN     1307625     8/2001
EP      0330452     8/1989
(Continued)

OTHER PUBLICATIONS

Office Action, U.S. Appl. No. 11/418,414 Oct. 19, 2007).
(Continued)

*Primary Examiner* — Mark Ruthkosky
*Assistant Examiner* — Ian Rummel
(74) *Attorney, Agent, or Firm* — Thompson Hine LLP

(57) ABSTRACT

A method for fabricating an electronic device or component such as an anisotropic conductive film comprising: distributing a plurality of conductive particles into an array of microcavities formed on a surface of a continuous carrier belt, rotating the belt carrying the conductive particles while conveying a surface of an adhesive layer into contact with the surface of the rotating belt, transferring the conductive particles from the microcavities on the belt to the adhesive layer in predefined locations in the adhesive layer corresponding to the array of microcavities on the belt, and separating the adhesive layer from the surface of the belt. In one embodiment, the position of the microcavities is varied in a controlled manner.

8 Claims, 10 Drawing Sheets

(51) Int. Cl.

| | | |
|---|---|---|
| *B65G 17/36* | (2006.01) | |
| *B32B 38/10* | (2006.01) | |
| *B32B 37/14* | (2006.01) | |
| *C09J 9/02* | (2006.01) | |
| *B32B 37/22* | (2006.01) | |
| *C09J 7/00* | (2006.01) | |
| *B32B 7/12* | (2006.01) | |
| *B32B 27/14* | (2006.01) | |
| *B32B 27/28* | (2006.01) | |
| *B32B 27/30* | (2006.01) | |
| *B32B 27/36* | (2006.01) | |
| *B32B 37/12* | (2006.01) | |
| *B32B 38/06* | (2006.01) | |
| *C08K 9/02* | (2006.01) | |
| *H05K 3/32* | (2006.01) | |

(52) U.S. Cl.
CPC ..... *B32B2310/0843* (2013.01); *B32B 2457/00* (2013.01); *C08K 9/02* (2013.01); *C08K 2201/001* (2013.01); *C09J 2201/28* (2013.01); *C09J 2201/602* (2013.01); *C09J 2203/326* (2013.01); *C09J 2205/102* (2013.01); *C09J 2433/00* (2013.01); *C09J 2461/00* (2013.01); *C09J 2463/00* (2013.01); *H05K 3/321* (2013.01); *Y10T 156/1066* (2015.01); *Y10T 428/24893* (2015.01); *Y10T 428/249921* (2015.04)

(56) References Cited

U.S. PATENT DOCUMENTS

| | | | |
|---|---|---|---|
| 4,606,962 A | 8/1986 | Reylek et al. | |
| 4,740,657 A | 4/1988 | Tsukagoshi et al. | |
| 4,877,761 A | 10/1989 | Chmiel et al. | |
| 5,087,494 A | 2/1992 | Calhoun et al. | |
| 5,136,359 A | 8/1992 | Takayama et al. | |
| 5,141,790 A | 8/1992 | Calhoun et al. | |
| 5,141,970 A | 8/1992 | McArdle et al. | |
| 5,162,087 A | 11/1992 | Fukuzawa et al. | |
| 5,163,837 A | 11/1992 | Rowlette, Sr. | |
| 5,216,065 A | 6/1993 | Colyer et al. | |
| 5,219,462 A | 6/1993 | Bruxvoort et al. | |
| 5,275,856 A | 1/1994 | Calhoun et al. | |
| 5,300,340 A * | 4/1994 | Calhoun et al. | 428/40.7 |
| 5,330,684 A | 7/1994 | Emori et al. | |
| 5,366,140 A | 11/1994 | Koskenmaki et al. | |
| 5,437,754 A | 8/1995 | Calhoun | |
| 5,438,223 A | 8/1995 | Higashi et al. | |
| 5,486,427 A | 1/1996 | Koskenmaki et al. | |
| 5,487,707 A | 1/1996 | Sharf et al. | |
| 5,522,962 A | 6/1996 | Koskenmaki et al. | |
| 5,533,447 A | 7/1996 | Johnson et al. | |
| 5,613,862 A | 3/1997 | Naylor | |
| 5,672,400 A | 9/1997 | Hansen et al. | |
| 5,769,996 A | 6/1998 | McArdle et al. | |
| 5,820,450 A | 10/1998 | Calhoun | |
| 5,839,188 A | 11/1998 | Pommer | |
| 5,851,644 A | 12/1998 | McArdle et al. | |
| 5,882,802 A | 3/1999 | Ostolski | |
| 5,916,641 A | 6/1999 | McArdle et al. | |
| 6,011,307 A | 1/2000 | Jiang et al. | |
| 6,042,894 A | 3/2000 | Goto et al. | |
| 6,120,946 A | 9/2000 | Johnson et al. | |
| 6,180,226 B1 | 1/2001 | McArdle et al. | |
| 6,214,460 B1 | 4/2001 | Bluem | |
| 6,274,508 B1 | 8/2001 | Jacobsen et al. | |
| 6,281,038 B1 | 8/2001 | Jacobsen et al. | |
| 6,352,775 B1 | 3/2002 | Sasaki et al. | |
| 6,402,876 B1 | 6/2002 | McArdle et al. | |
| 6,423,172 B1 | 7/2002 | McArdle et al. | |
| 6,555,408 B1 | 4/2003 | Jacobsen et al. | |
| 6,566,744 B2 | 5/2003 | Gengel | |
| 6,632,532 B1 | 10/2003 | Yamada et al. | |
| 6,671,024 B1 | 12/2003 | Uchiyama | |
| 6,672,921 B1 | 1/2004 | Liang et al. | |
| 6,683,663 B1 | 1/2004 | Hadley et al. | |
| 6,751,008 B2 | 6/2004 | Liang et al. | |
| 6,770,369 B1 | 8/2004 | Oyamada et al. | |
| 6,784,953 B2 | 8/2004 | Liang et al. | |
| 6,788,452 B2 | 9/2004 | Liang et al. | |
| 6,833,943 B2 | 12/2004 | Liang et al. | |
| 6,834,612 B2 | 12/2004 | Chambers | |
| 6,884,833 B2 | 4/2005 | Chheang et al. | |
| 6,906,427 B2 | 6/2005 | Tanaka et al. | |
| 7,291,393 B2 | 11/2007 | Wakiya et al. | |
| 7,923,488 B2 | 4/2011 | Xu et al. | |
| 2001/0008169 A1 | 7/2001 | Connell | |
| 2002/0184754 A1* | 12/2002 | Yang | 29/827 |
| 2005/0118845 A1 | 6/2005 | Kobayashi et al. | |
| 2006/0054867 A1 | 3/2006 | Yamada | |
| 2006/0280912 A1 | 12/2006 | Liang et al. | |
| 2007/0175579 A1 | 8/2007 | Otani et al. | |
| 2008/0164812 A1 | 7/2008 | Tsai et al. | |
| 2008/0191174 A1 | 8/2008 | Ehrensvard et al. | |
| 2009/0053859 A1 | 2/2009 | Xu et al. | |
| 2009/0181165 A1 | 7/2009 | Liang et al. | |
| 2010/0101700 A1 | 4/2010 | Liang et al. | |
| 2010/0317545 A1 | 12/2010 | McNamara et al. | |
| 2011/0114256 A1 | 5/2011 | Otani et al. | |

FOREIGN PATENT DOCUMENTS

| | | |
|---|---|---|
| EP | 1168373 | 1/2002 |
| JP | 63-91907 | 4/1988 |
| JP | 07-173667 | 7/1995 |
| JP | 2002519473 | 7/2002 |
| JP | 2003220669 | 8/2003 |
| JP | 2007-224111 | 9/2007 |
| JP | 2009-029862 | 2/2009 |
| JP | 2011-026539 | 2/2011 |
| KR | 10-0377603 | 11/2003 |
| WO | 00/00563 | 1/2000 |
| WO | 2007/130127 | 11/2007 |
| WO | 2007/130137 | 11/2007 |

OTHER PUBLICATIONS

Office Action, U.S. Appl. No. 11/418,414 (Apr. 30, 2008).
Office Action, U.S. Appl. No. 11/418,414 (Oct. 29, 2008).
Office Action, U.S. Appl. No. 11/418,414 (Apr. 30, 2009).
Office Action, U.S. Appl. No. 12/220,960 (Jun. 12, 2009).
International Search Report, International Application No. PCT/US2006/042229 (mailed Jun. 17, 2008, published Nov. 15, 2007).
International Preliminary Report on Patentability, International Application No. PCT/US2006/042229 (Mar. 24, 2009).
International Search Report, International Application No. PCT/US2006/046807 (mailed Feb. 2, 2009, published Nov. 15, 2007).
International Preliminary Report on Patentability, International Application No. PCT/US2006/046807 (Mar. 30, 2009).
International Search Report and Written Opinion, International Application No. PCT/US2012/054375 (Jun. 24, 2013).
Office Communication, European Application No. 06844998.2 (Feb. 2, 2012).
Search Report, European Application No. 06844998.2 (Jun. 14, 2012).
Notice of the Reason for Rejection (with English translation), Korean Application No. 2008-7028483 (May 27, 2013).
Asai, S. et al., "Development of an Anisotropic Conductive Adhesive Film (ACAF) from Epoxy Resins," Journal of Applied Polymer Science, vol. 56, pp. 769-777 (1995).
Dokoutchaev, A. et al., "Colloidal Metal Deposition onto Functionalized Polystyrene Microspheres," Chem. Mater., 11, pp. 2389-2399 (1999).
Gengel, G., "A Process for the Manufacture of Cost Competitive MCM Substrates," MCM '94 Proceedings, pp. 182-187 (1994).
Ishibashi, K. et al., "A New Anisotropic Conductive Film with Arrayed Conductive Particles," AMP Journal of Technology, vol. 5, pp. 24-30 (Jun. 1996).

(56) References Cited

OTHER PUBLICATIONS

Mescher, P. et al., "Application Specific Flip Chip Packages: Considerations and Options in Using FCIP," Proceedings of Pan Pacific Microelectronics Symposium Conference (Jan. 2000).

Nuzzo, R.G. et al., "Adsorption of Bifunctional Organic Disulfides on Gold Surfaces," J. Am. Chem. Soc., 106, pp. 4481-4483 (1983).

Ugelstad, J. et al., "Biomedical Applications of Monodisperse Magnetic Polymer Particles," Future Directions in Polymer Colloids, El-Aasser and Fitch (ed), Martinus Nijhoff Publishers, pp. 355-370 (1987).

Ugelstad, J. et al., "Preparation and Application of Monodisperse Polymer Particles," Journal of Polymer Science: Polymer Symposium 72, pp. 225-240 (1985).

Ugelstad, J. et al., "Swelling of Oligomer-Polymer Particles, New Methods of Preparation of Emulsions and Polymer Dispersion," Advances in Colloid and Interface Science, 13, pp. 101-140 (1980).

Yamaguchi, M. et al., "Cupil-T Anisotropic Conductive Film for Testing," Nitto Giho, vol. 40, pp. 17-20 (Sep. 2002).

Office Action (with English translation), Taiwanese Application No. 095146567, Sep. 26, 2013.

Liang, R-C. et al., "Fixed-Array Anisotropic Conductive Film (FACF) for Ultra Fine Pitch Applications," ICFPE Proceedings, Paper S1-2-4, Hsinchu, Taiwan (2010).

Liang, R.-C. et al., "Ultra Fine Pitch Anisotropic Conductive Film with Fixed Array of Conductive Particles," IDW'10 Proceeding, p. 1909, Paper FMC4-4, Fukuoka, Japan (2010).

"Ultra-Fine Pitch Fixed Array ACF," Tech on Chinese (Mar. 1, 2011).

PCT, International Search Report and Written Opinion, International Application No. PCT/US2012/054375 (Jun. 24, 2013).

Office Action, U.S. Appl. No. 12/608,955 (Aug. 16, 2013).

Office Action, U.S. Appl. No. 13/233,360 (Mar. 14, 2014).

EP, Partial Search Report, European Application No. 13171999 (May 6, 2014).

Notice of the Reason for Rejection (with English translation), Korean Application No. 2010-7028483 (Nov. 28, 2013).

JP, Japanese Application No. 2003-220669 (Aug. 2003).

EP, Supplemental Search Report, European Application No. 06844998.2 (Feb. 20, 2012).

EP, Partial Search Report, European Application No. 13171999.9, dated May 14, 2014.

US, Office Action, U.S. Appl. No. 12/608,955, dated Jan. 3, 2014.

US, Notice of Allowance, U.S. Appl. No. 12/608,955, dated Apr. 25, 2014.

\* cited by examiner

US 9,102,851 B2

MICROCAVITY CARRIER BELT AND METHOD OF MANUFACTURE

FIELD OF INVENTION

This invention relates to a method for manufacturing electronic devices and components such as anisotropic conductive films (ACF). This invention represents an improvement in the invention disclosed in U.S. Published Application 2010/0101700 to Liang et al. ("Liang '700").

BACKGROUND OF INVENTION

For a discussion of the background of the invention reference may be made to Liang '700 cited above. Liang '700 discloses a method for manufacturing ACFs having a non-random array of conductive particles by providing a carrier web having a non-random array of microcavities and distributing the conductive particles into the microcavities. Preferably, the particles are distributed on the carrier web so that there is one particle in each cavity. The carrier web is conveyed into contact with an adhesive film and the particles are transferred to the film upon contact.

SUMMARY OF THE INVENTION

One manifestation of the invention is a process for manufacturing an electronic device such as an ACF using a continuous belt or loop having an array of microcavities formed in one surface as the carrier web for conductive particles. The belt is used in a manner analogous to the web in the process disclosed in the Liang '700 publication.

Another manifestation of the invention is a carrier belt useful in manufacturing device components such as ACF in the aforementioned process and, more particularly, chip on film (COF) or chip on glass (COG) devices.

Another manifestation of the invention is a carrier belt or web in which the microcavities are arranged in a non-random but variable pattern to reduce the effect of periodic defects.

Another manifestation is a carrier belt that includes a stitching line that extends across the belt, preferably at an oblique angle and a method for forming the same.

DETAILED DESCRIPTION

Liang '700 is incorporated herein, in its entirety, by reference.

Figure 1:
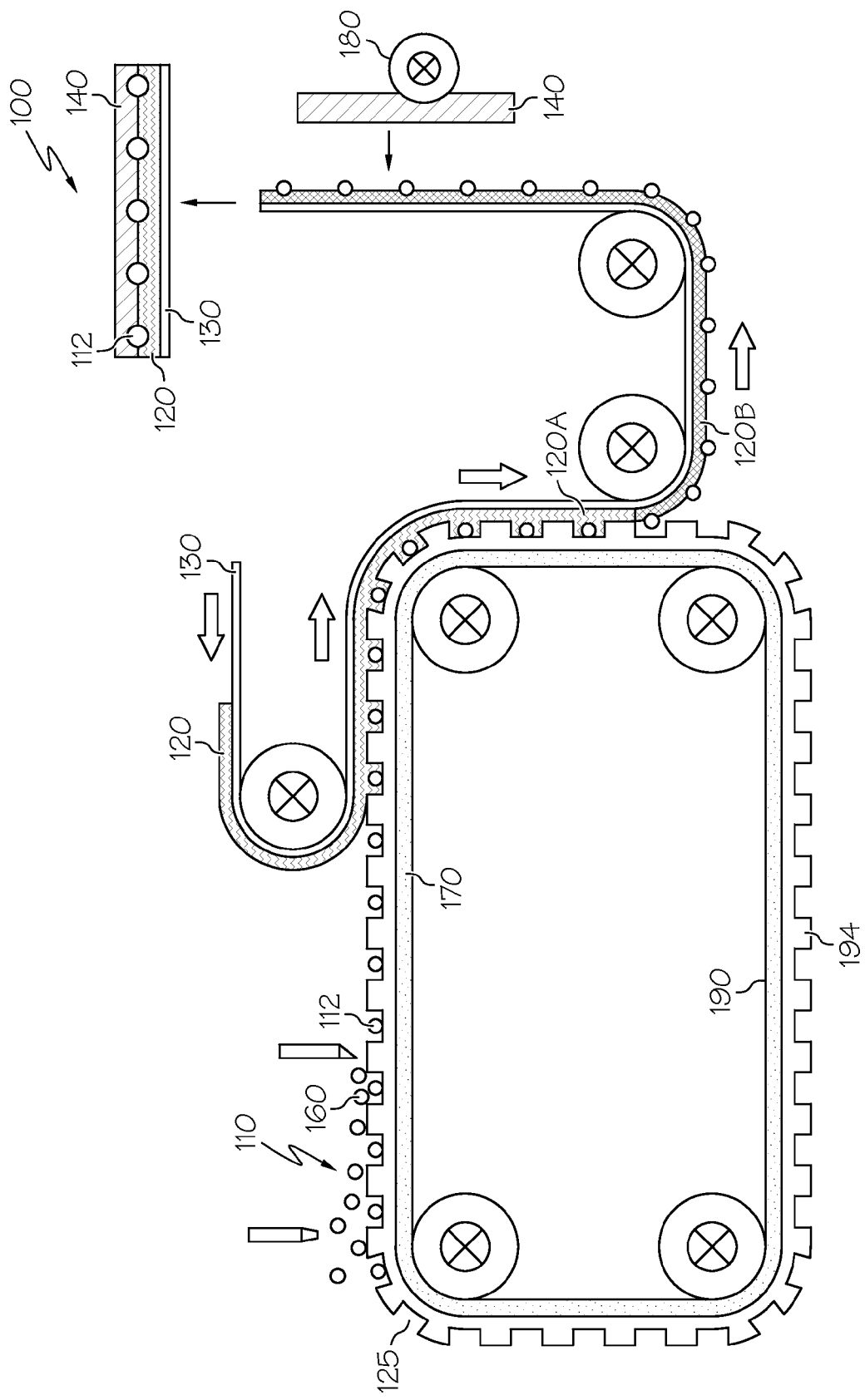
FIG. 1 is a schematic illustration of a manufacturing process in accordance with one embodiment of the invention.
Figure 2:
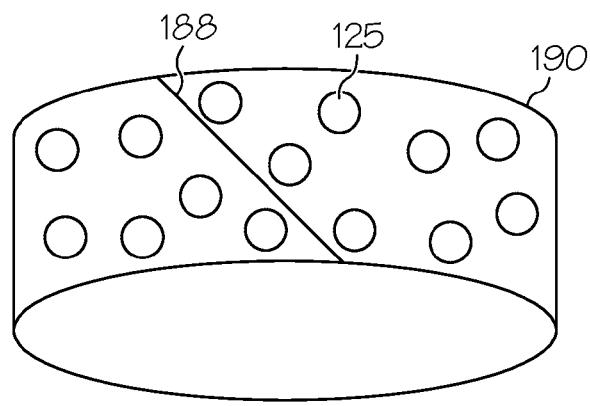
FIG. 2 is a perspective view of a carrier loop or belt in accordance with one embodiment of the invention.

FIG. 1 illustrates a manufacturing process using a continuous carrier belt or loop 190 having an array of microcavities 125 on its surface in accordance with one embodiment of the invention. The belt 190, as shown in FIG. 2, includes a stitching line 188. The belt is formed by abutting the cut end surfaces of a web, which have been cut at an oblique angle, and securing them with an adhesive as described herein. The stitching line is preferably at an oblique angle, i.e., less than 90° (as measured with respect to the longitudinal edges of the web) in order to minimize the frequency with which an electrode (for example, an electrode in a device such as a microchip) oriented parallel the cross-machine direction of a ACF does not contact a sufficient number of conductive particles in the film to complete a circuit.

The stitching line interrupts the microcavity array on the belt and, in turn, the array of conductive particles on the surface of the ACF. If the stitching line is oriented at 90° to the belt, i.e. parallel the cross-machine direction of the belt, the array of conductive particles in an ACF made by transferring conductive particles from the belt will not include conductive particles in the area corresponding to the stitching line. If the stitching line width is comparable to or greater than the electrode width, at least one electrode may not contact any conductive particle if the stitching line angle is oriented at 90° with respect to the longitudinal edge of the belt. On the other hand, an oblique stitching line insures that each electrode will contact sufficient conductive particles to complete a circuit on the ACF.

Figure 8:
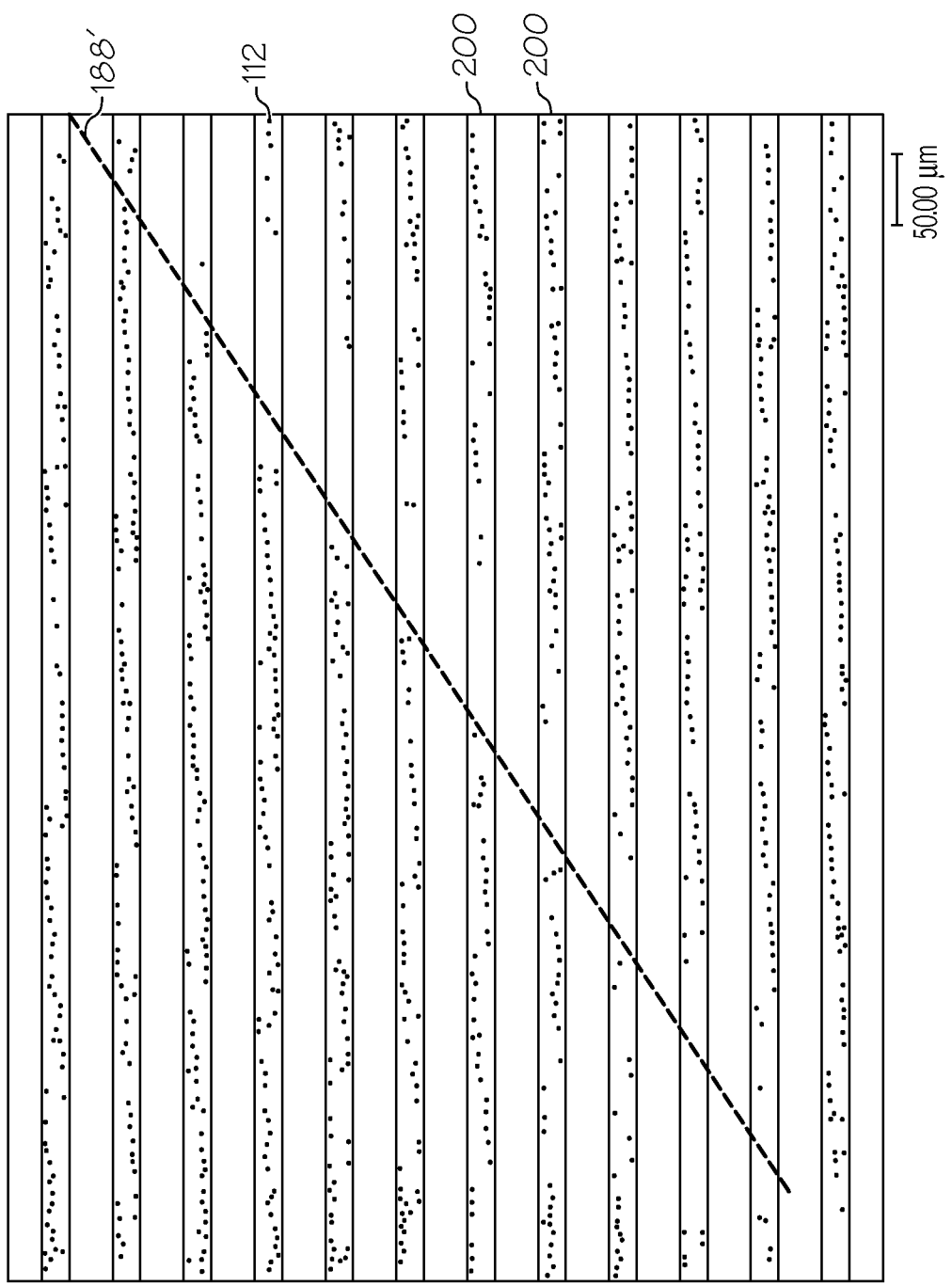
FIG. 8 is an illustration of an electronic device showing the distribution of conductive particles with respect to a series of electrodes.

The desired angle for the stitching line will depend on the orientation of the electrodes in the device assembled with the ACF. For many applications the angle is about 30° to 80° and, more particularly about 35° to 65°, and still more particularly about 45°. The optimum angle for the stitching line is dependent upon the stitching gap and the minimum number of particles required to maintain conductivity after HHHT or long-term aging. In a typical LCD, electrodes of 20 micron (width)×1000 micron (length) having a 50 micron pitch (about 30 micron spacing between electrodes) in the cross machine direction of the web of the ACF are commonly used. In the bonding area, a 75° angle stitching line of the ACF covers four electrodes while a 45° angle stitching line covers 24 electrodes. Since no or few conductive particles are present in the stitching line area, a significantly wider area of missing particles or poor connection will be observed in the case of 75° angle stitching than that of the 45° angle stitching. FIG. 8 shows a 400× photomicrograph after bonding 50 micron pitch electrodes 200 pitch with an ACF with a particle-particle pitch of about 8 micron. The area 188' corresponding to a 60° stitching line with a 40 micron stitching gap does not contain any conductive particles. In this particular example, the distance or gap between particles across the stitching line is 80 microns measured along the electrode and represents less than 10 percent of the 1,000 micron stitching line length. There are 58-60 particles contacting the electrodes crossing the stitching line compared with 64-66 particles contacting an electrode not crossing the stitching line. This is well above the minimum number of particles required to establish electrical contact, which is generally about 5 to 10 particles per electrode.

The microcavity array can be formed directly on the continuous belt or on a cavity-forming layer 194 coated on the carrier web 170. Suitable materials for the carrier web 170 include, but are not limited to, polyesters such as polyethylene terephthalate (PET) and polyethylene naphthalate (PEN), polycarbonate, polyamides, polyacrylates, polysulfone, polyethers, polyimides, and liquid crystalline polymers and their blends, composites, laminates or sandwich films. In one embodiment, the carrier web is VN300™ a Kapton® (aromatic polymide) film available from DuPont. A suitable cavity-forming layer 194 can include, without limitation, a thermoplastic material, a thermoset material or its precursor, a positive or a negative photoresist, or an inorganic material.

To achieve a high yield of particle transfer, in one embodiment of the invention, the surface of the carrier web may be treated with a thin layer of release material to reduce the adhesion between the microcavity carrier web 190 and the adhesive layer 120. The release layer may be applied by coating, printing, spraying, vapor deposition, thermal transfer, or plasma polymerization/crosslinking either before or after the microcavity-forming step. As disclosed in Liang '700, suitable materials for the release layer include, but are not limited to, fluoropolymers or oligomers, silicone oil, fluorosilicones, polyolefins, waxes, poly(ethyleneoxide), poly (propyleneoxide), surfactants with a long-chain hydrophobic block or branch, or their copolymers or blends.

The microcavities can be formed in the belt using processes such as a laser ablation process, an embossing process, a stamping process, a lithographic process and similar processes. In one embodiment different shape and dimension patterns were fabricated using UV excimer laser ablation on a polyimide web through a photomask. Shape and dimension of the produced micron patterns and pattern arrangements are pre-determined by the photomask design. Micron patterns can then be stitched together thru this projection ablation system with either a step-and-repeat or a scanning algorithm. The varieties of the patterns dimension, shapes and spacing are disclosed in US published patent applications Liang, US 2006/0280912 and Liang '700. The fixed array patterns may vary. In the case of circular microcavities, the pattern may be represented by X-Y where X is the diameter of the cavity and Y is the edge-to-edge distance between the adjacent cavities in microns. Typical microcavity pattern pitches include 5-3, 5-5, 5-7, and 6-2 patterns. The pattern selected will depend in part on the number of particles required for each electrode. To reduce the minimum bonding space of electrodes, the microcavity pattern may be staggered.

Figure 6:
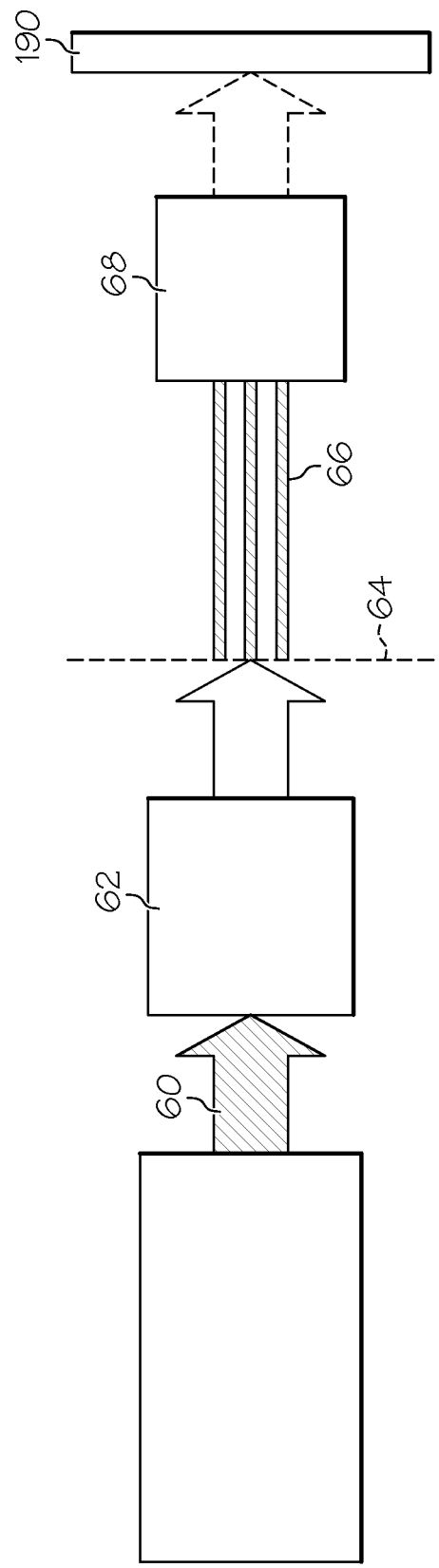
FIG. 6 is a schematic illustration of a laser projection system used in one embodiment of the invention for forming the microcavities in the carrier web.

FIG. 6 shows one example of a mask-based laser projection ablation system in which the laser beam 60 passes through beam shaping optics 62 to even out the laser intensity. The desired microcavity pattern arrangement is generated thru the photomask 64 to yield a plurality of laser beams 66 having the desired dimension and shape. The beam intensity or the number of beam pulses is adjusted in conjunction with a projection lens system 68 to produce microcavities in the web having the desired opening and depth. The lens system 68 can be used for optical reduction. As discussed below, the cavity-to-cavity distance may be offset or randomized in a controlled manner to reduce the effect of periodical line defects during bonding as discussed below. The size of the cavities may be selected such that each cavity accommodates only one conductive particle. In one embodiment the conductive particles and the microcavities are about 2 to 10 microns in diameter or across the cavity in the case of noncircular cavities.

Figure 7:
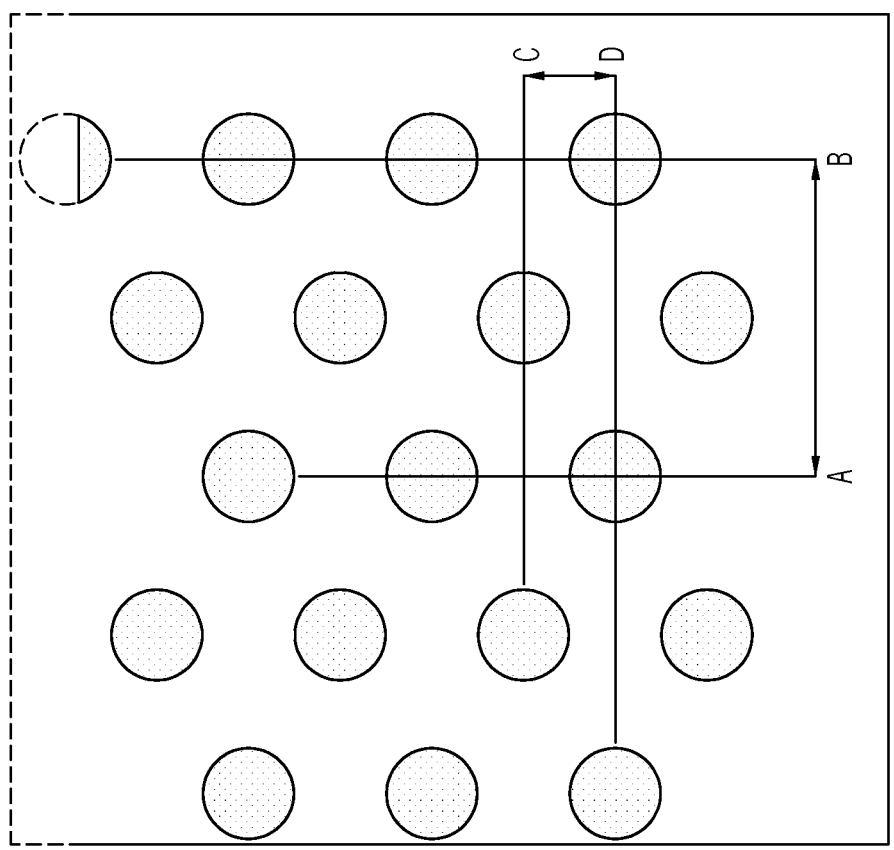
FIG. 7 is a top view of a carrier web in accordance with one embodiment of the invention having microcavities that are slightly offset or randomized to reduce moire pattern and periodic manufacturing defects.

In accordance with one embodiment of the invention, the microcavities are positioned to reduce the effect of periodic/repetitive line defects in the conductive particle pattern. In accordance with one embodiment of the invention, a controlled but variable adjustment is made in the position of the microcavities to prevent these defects. FIG. 7 schematically illustrates a top view of a microcavity pattern in accordance with one embodiment of the invention. The line AB represents the pitch in the x-direction and the line C-D represents the pitch in the y-direction. In one embodiment of the invention, AB equals 2*CD*sqrt 3 where "sqrt 3" is the square root of 3. Using a random number generator algorithm, the position of the cavities can be randomized with a pre-defined variation. This controlled randomization of variations of cavity to cavity distances is referred to herein as non-constant pitch repetition. One such equation is:

$$\text{position variation} = [\text{Norm.}s.\text{dist}(\text{rand}(\ )*3.2,\text{true}) \text{minus } 0.5]*2*X\%$$

where Norm.s.dist is a standard normal distribution function and rand is a random number function. The normal distribution function Norm.s.dist (rand( )) was chosen instead of simple random number function so that the major influence on the position is at both end points (e.g., more data will be close to either 1 or −1) as contrasted with a pure random distribution between −1 to 1. The Norm.s.dist(rand( )) function is specific to Microsoft Excel, but the concept of using a normal distribution function and a random number generator should be applicable to any statistical package. In accordance with the invention, X % is the variation in the designed location. In one embodiment, X % can be selected from 1 to 40%, preferably about 3 to 20% and more preferably about 5 to 10%. The numeric value of 3.2 in the equation represents 3.2 sigma in a standard normal distribution function. X % is selected based on cavity distance pattern (e.g., 5-3, 5-5 etc.). The 2*X % (for which the variation factors ranged from −1 to 1 for two adjacent cavities) is the longest possible distance in the designated direction between two cavities thus the longest possible distance between two adjacent particles. Based on the cavity pattern used, one can calculate the possible distances among conductive particles, thus X % can be selected such that the distances are consistent with the conductive particle distribution that is required.

Particle deposition 110 of the conductive particles 112 may be effected by applying a fluidic particle distribution process and entrapping process, in which each conductive particle is entrapped into a single microcavity 125. There are a number of entrapping processes that can be used. For example, a roll-to-roll continuous fluidic particle distribution process can be used to entrap only one conductive particle into each microcavity as shown in FIGS. 5A-5D.

Figure 5A:
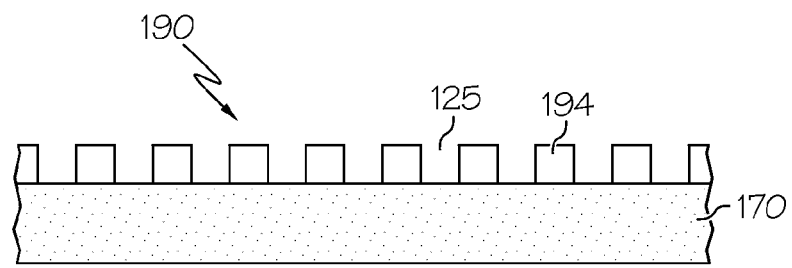
FIG. 5 is a schematic illustration of the application of the conductive particles with one particle in each microcavity.
Figure 5B:
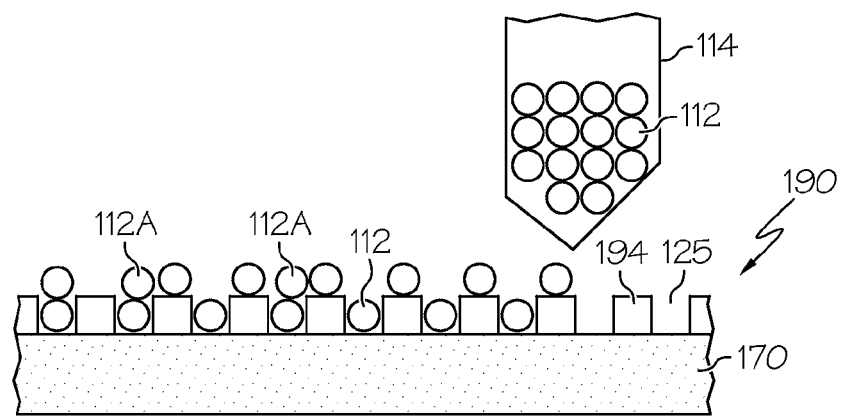
Figure 5C:
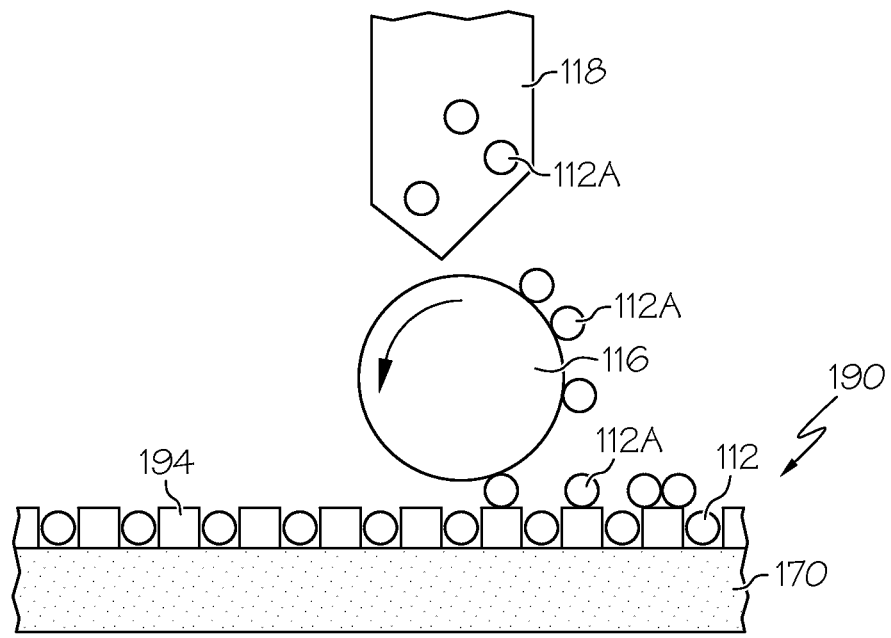
Figure 5D:
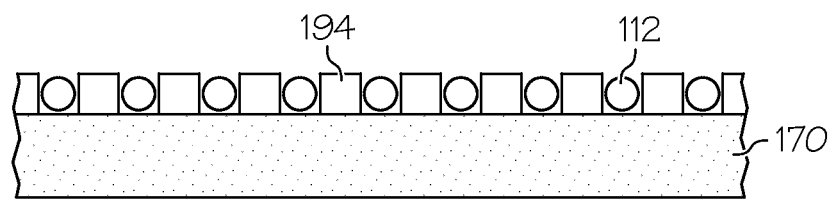

FIG. 5A illustrates the microcavity web prior to application of the conductive particles 112. The particles are dispensed from a hopper 114 onto the surface of the web 190. Excess particles 112A are removed as shown in FIG. 5C. The particle coated web 190 is contacted with a roller 116 having a tacky surface. This roller contacts and collects the particles 112A not entrapped within a microcavity 125. The roller 116 transports the removed particles 112A to a suction device 118 where the particles 112A are removed from the surface of the roller 116 by suction.

In one embodiment, the microcavity loop is placed onto a particle filling coater with cantilever rollers. For example, a 3 to 6 wt % dispersion of conductive particles in isopropyl alcohol (IPA) was mixed by mechanical stirring and dispensed by a fluidic process such as slot die coating through L/S 13 tubing with a Masterflex pump available from Cole Parmer. Conductive particles were filled into microcavities using a 100% knitted polyester wiper wrapped roller. Excess particles (outside of the microcavity) were carefully removed using a polyurethane roller from Shima American Co., with a vacuum device to recycle conductive particles. The recovered particles may be collected and recirculated to the supply hopper 114 for reapplication to the web 190. In one embodiment, more than one dispensing station 110 may be employed to ensure that a conductive particle 112 is entrapped in each microcavity 125 and thereby minimize or reduce the number of microcavities not containing particles.

It is not essential that all the microcavities entrap a particle provided that sufficient number of conductive particles are deposited on the adhesive layer to establish a conductive pattern. While not exhaustive, other processes that can be applied for entrapping the particles in the microcavities in accordance with other embodiments are described in Liang '700. However, to avoid undesirable short circuit particularly in fine pitch applications, it's important that each microcavity contain essentially no more than one particle. The optimum microcavity dimension is dependent on the size of the particles used.

The entrapped particles 112 then can be transferred from the microcavity array to predefined locations on an adhesive layer 120. Typically, the distance between these transferred conductive particles must be greater than the percolation threshold, which is the density threshold at which the conductive particles become connected or aggregate. In general, the percolation threshold is a function of the structure/pattern of the microcavity array structure and to the plurality of conductive particles.

In one alternative, a non-contact vibration assisted fluid particle distribution process can be used to carry out the conductive particle dispensing and entrapping process. The vibration may be generated by a mechanical wave source, an electrical wave source, a magnetic wave source, an acoustic wave source, or an ultrasonic wave source. To achieve greater than about 90% entrapping yield, the frequency of the vibration source may be in the range of between about 1 Hz to about 1 million Hz, or about 100 Hz to about 100,000 Hz, or about 250 Hz to about 60,000 Hz. A wide range of variation in the relation between the microcavity diameter and the diameter of the particle can be accommodated in this manner.

It can be desirable to employ one or more processes to remove excess conductive particles, for example, after fluidic assembly. Roll-to-roll continuous fluidic particle distribution processes may include a cleaning process to remove excess conductive particles from the top of microcavity array. A cleaning process may be a non-contact cleaning process, a contact cleaning process, or an effective combination of non-contact and contact cleaning processes.

Certain exemplary embodiments of the particle cleaning process, employ a non-contact cleaning process, including, without limitation, one or more of a suction process, an air blow process, or a solvent spray process. Removed excess conductive particles can be accumulated, for example, by a suction device for recycle or reuse. The non-contact suction process can further be assisted by dispensing a cleaning fluid such as, without limitation, by spraying a solvent or a solvent mixture, to improve the cleaning efficiency.

Certain other exemplary embodiments of the present invention may employ a contact cleaning process to remove the excess conductive particles from the surface of the microcavity array. The contact cleaning process includes the use of a seamless felt, a wiper, a doctor blade, an adhesive material, or a tacky roll. When a seamless felt is applied, a suction process also may be used to recycle conductive particles from the seamless felt surface and to refresh the felt surface. In this felt/suction process, both capillary force and suction force draw the excess conductive particles with suction force applied from inside of seamless felt to remove and recycle the excess particles. This suction process can be further assisted by dispensing a cleaning fluid, a solvent, or a solvent mixture to improve the cleaning efficiency.

After the fluidic filling step 160, the conductive particles in the microcavities may be transferred to the substrate 130, which is pre-coated with an uncured adhesive 120 or which is coated on the process line. The microcavity belt 190 is reused by repeating the particle filling and transferring steps.

Figure 3A:
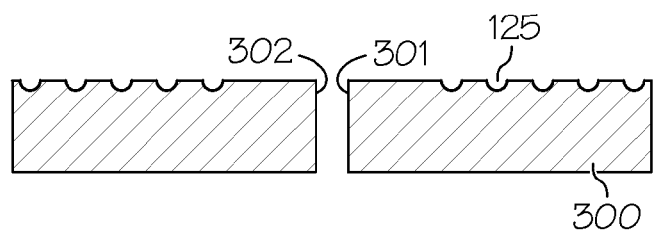
FIGS. 3A-3F illustrate a method of the abutment and stitching of the carrier loop or belt in accordance with one embodiment of the invention.
Figure 3B:
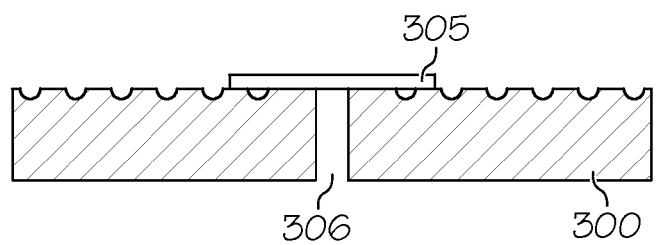
Figure 3C:
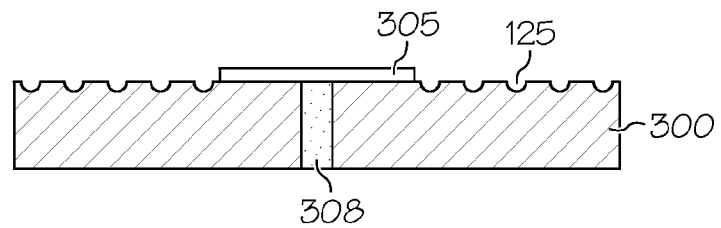
Figure 3D:
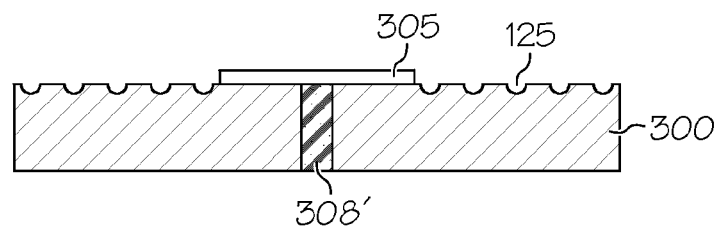
Figure 3E:
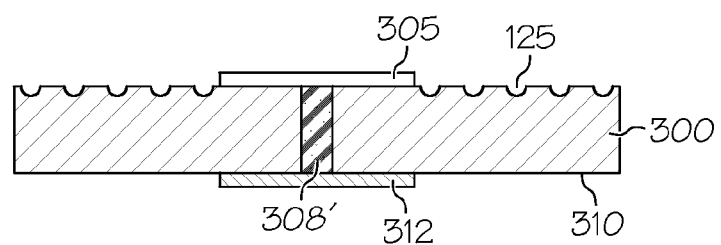
Figure 3F:
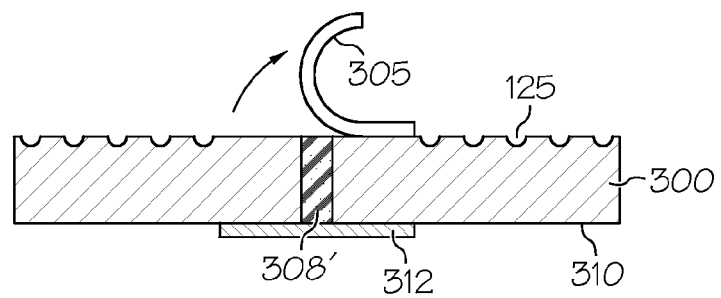

One method for assembling the belt or loop 190 is illustrated in FIGS. 3A-3F. The ends 301 and 302 of a web 300 are cut at the appropriate/desired stitching angle. The web 300 includes microcavities 125. In one embodiment, the cut surfaces are activated by corona discharge. The ends 301 and 302 of the web 300 can be placed in an abutting relationship using a vacuum table or similar positioning device. The ends 301 and 302 are abutted as shown in FIG. 3A. To keep the ends in position while the seam is bonded, they may be secured with masking tape 305 as shown in FIG. 3B. The gap 306 between the abutting ends 301 and 302 of the web 300 is filled with a joint adhesive 308. A joint adhesive is selected for bonding the cut end surfaces which, when cured or hardened, does not adhere to the conductive particles subsequently distributed and carried on the surface of the web. Suitable joint adhesives include, but are not limited to, UV, moisture, thermal and room temperature curable or hardenable adhesive such as room temperature vulcanizable silicone rubber adhesives, polyisocyanate adhesives, UV curable adhesives, epoxy and polyurethane adhesives, acrylics, multifunctional acrylates, multifunctional methacrylates, cyano acrylates, vinylethers, vinyl esters, valcunizable thermoplastic elastomers or unsaturated rubbers. Optionally, a release agent such as fluoro or silicone compounds including silicone epoxides or silicone acrylates may be incorporated into the adhesive compositions. After applying the joint adhesive 308 as shown in FIG. 3C, the adhesive is cured 308', as shown in FIG. 3D. The backside 310 of the web 300 is reinforced with a coating or adhesive 312 (about 1-50 micron thick) which may be the same type of adhesive as the joint adhesive. The adhesive 312 may optionally be further reinforced with a backing film (not shown) such as polyimide, polyamide, polyethylene terephthalate (PET), polyethylene naphthalate (PEN), polysulfone, polycyclicolefin, or the like. An UV curable adhesive is particularly preferred since it can be cured rapidly through the backing film. Once the backing layer adhesive has cured, the masking tape 305 can be removed as shown in FIG. 3F. Additionally, in order to minimize interference from the stitching gap, in one embodiment, the adhered stitching line may be polished and, in one embodiment, additional microcavities may be generated in the area of the stitching line by laser ablation under microscope. It will be apparent that between the cured adhesive 308' and the backing adhesive 312, the carrier must be strong enough to withstand the tension and stress that develops in the belt during the manufacturing process. The method illustrated in FIG. 3 can be performed using a single web to produce a loop as discussed, and it can be performed using two or more webs as a means for splicing the webs and producing a longer web or a loop having a larger diameter. In the latter cases the spliced web may have two or more stitching lines.

Figure 4:
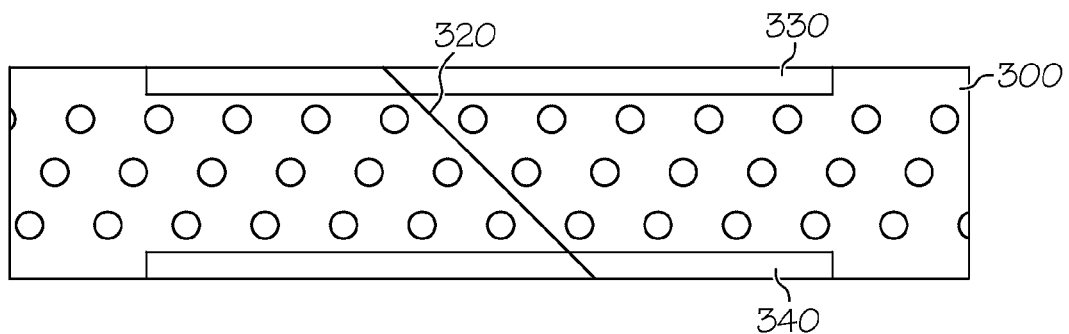
FIG. 4 illustrates an embodiment in which the ends of the stitching line are reinforced with a structural adhesive tape.

FIG. 4 illustrates a further embodiment of the invention in which the web 300 is reinforced at the ends of the stitching line 320 along the edge of the tape 300 by a pair of edge tapes 330 and 340. These edge tape reinforcements may be made from any of a variety of materials. One particularly useful edge reinforcing material is structural adhesive tape such as an aluminium tape.

As shown in FIG. 1, the adhesive composition 120 is provided on a substrate or release film 130. The adhesive composition may be an epoxy composition. In one embodiment, it may be the composition disclosed in U.S. Published Applications 2010/0317545, 2010/0101700, 2009/0181165; U.S. Pat. Nos. 7,923,488; 4,740,657; 6,042,894; 6,352,775; 6,632,532; *J. Appl. Polymer Sci.*, 56, 769 (1995) and *J. Mater. Sci.*, (2008) 43, 3072-3093, which are herein incorporated by reference in their entirety. In one embodiment, the adhesive contains core-shell rubber particles such as Dow Chemical Company EXL2335 in an amount of about 0.5 to 10 weight % as a toughening agent or a compatibilizer of the ingredients.

To achieve high yield of particle transfer from the microcavity loop to the adhesive layer 120, the cohesion strength of the adhesive layer 120 should be no less than the adhesion strength between the adhesive layer and the microcavity array 125; the adhesion strength between the adhesive layer and microcavity array should be less than the adhesion strength between the adhesive layer and the substrate 130 (release liner) that carries the adhesive layer. The adhesion strength of the adhesive to the microcavity array film or the release liner may be controlled by the properties of the release coating and the microcavity array film, the adhesive composition, and the use of surface treatment including corona and plasma treatments or a combination thereof.

In accordance with one embodiment of the invention, the coated adhesive may be pre-conditioned or annealed before contacting the microcavity belt. Pre-conditioning temperatures are typically higher than the heat distortion or glass transition temperature of the adhesive and lower than the onset temperature at which the adhesive starts to cure. In one embodiment, the glass transition temperature of the adhesive is about 20° C. and the onset curing temperature of the adhesive is about 60° C. Under these conditions, a pre-conditioning or annealing temperature of about 25 to 35° C. is useful.

The table below shows the effect of pre-conditioning on the release force or the adhesion between the adhesive and the substrate 130. For this comparison, four coating compositions were used. The results are shown below. In all cases, the release force was strongly dependent on the pre-conditioning.

| Release force (mN/1.2 mm) | Composition (A) | Composition (B) | Composition (C) | Composition (D) |
| --- | --- | --- | --- | --- |
| No pre-conditioning | 3.28 | 2.81 | 5.54 | 7.76 |
| pre-conditioned, 25° C., 24 hours | 1.66 | 1.73 | 2.04 | 2.27 |
| pre-conditioned, 35° C., 24 hours | 1.23 | 0.82 | 1.73 | 1.22 |

In one embodiment, the peeling angle between the microcavity carrier belt 190 and the adhesive layer 120 is in the range of between slightly above 0° to about 135°, relative to the surface of the belt 190. In some selected embodiments, it may be preferred that the peeling angle be in the range of about 30° to about 90°. Also, it is desirable that during the particle transfer process, the surface temperature of the adhesive layer be in the range of between about 0° C. to about 90° C. In certain selected embodiments it may be preferred that the surface temperature of the adhesive layer be in the range of about 15° C. to about 60° C. Additionally, it can be desirable to maintain the pressure of the particle transfer process in the range of about 0.1 megapascals to about 100 megapascals. Furthermore, it can be desirable that the adhesive layer have a Young's modulus in the range of about 0.01 megapascals to about 100 megapascals. In some embodiments, it may be preferred to have the Young's modulus of the adhesive layer be in the range of about 0.1 megapascals to about 10 megapascals. To facilitate the particle transfer, the adhesive before or during the particle transfer step may be softened by heat or plasticized by a fugitive solvent at or near the location 120A in FIG. 1. After particle transfer, the adhesive may be chilled down or the fugitive solvent evaporated at the location 120B in FIG. 1.

The modulus or cohesion strength of the adhesive also can be important for successful transfer. The adhesive modulus may be adjusted by adjusting the amount of residual solvent in adhesive and/or by adjusting the transfer temperature. For example, a desirable modulus can be obtained for a transfer temperature of up to about 40° C. that can apply to a number of cases. Changing the composition and amount of the residual solvent can affect the range of the transfer temperature and in some cases can bring the transfer temperature to room temperature.

In some case, it is advantageous to use an adhesive layer exhibiting a modulus gradient across adhesive thickness, with a higher modulus on the release liner side and lower modulus on the adhesive side. The modulus gradient can be achieved by introducing a trace amount of solvent from conductive particle distribution process, by adjusting the temperature gradient introduced during transfer process, or by both. A temperature gradient may be achieved by applying a surface heating source, by using a heat sink from the release liner, or both. The surface heating source can be, without limitation, a heated roll source, an infrared source, a hot air source, or a wire source. Suitable combinations of these exemplary sources also may be desirable.

Typically the adhesive layer 120 is disposed on a substrate 130 such as polyethylene terephthalate (PET) and polyethylene naphthalate (PEN), polycarbonate, polyamides, polyacrylates, polysulfone, polyethers, polyimides, and liquid crystalline polymers film. After the conductive particles are transferred, the film is slit and wound into reels. The backside of the substrate then contacts the top surface of the adhesive. In this scenario, the following condition must be met to have proper release:

A non-limiting exemplary embodiment of a conductive particle transfer process can employ a differential shear process between the adhesive layer and the microcavity array. The differential shear is achieved by web speed differentiation between the adhesive coated release liner and the microcavity array. The web speed of release liner can be slightly higher or lower than that of the microcavity array.

After the conductive particles are transferred to the adhesive layer, the particles can be partially embedded in the adhesive layer. These partially embedded conductive particles can improve the ACF bonding performance with higher adhesion strength, reduced voids, and lower contact resistance. Optionally, after the conductive particles are transferred to the adhesive layer, the adhesive layer may further be treated to have a modulus gradient and a viscosity gradient built across the adhesive layer, with the side of adhesive surface bearing the conductive particles possessing a higher modulus and a higher viscosity. This higher modulus and higher viscosity can help to maintain the conductive particles at their non-random array location during ACF bonding applications. The viscosity gradient across adhesive layer can be achieved by applying a heating process, including, without limitation, surface radiation, infrared radiation, UV radiation, a or a heated roll heating process. Suitable combinations of these heating processes also can be efficacious.

As disclosed in Liang '700, optionally a second substrate 140 can be applied on the top side of the adhesive layer for protection and improved release property of the adhesive. The adhesion strength between the adhesive layer 130 and the first substrate or the second substrate 140 must be weaker than the cohesion strength of the adhesive layer. The adhesion strength between the adhesive layer and the first substrate must be stronger than the adhesion strength between the adhesive layer and the second substrate. The adhesion strength between the adhesive layer and the first substrate must be weaker than the adhesion strength between the adhesive layer and the bonding substrate, such as print circuit board, flexible print circuit board, polymer film, glass, etc., to be able to release the substrate after the pre-bonding process of ACF bonding application.

The resultant film 100 may be used directly as a non-random array ACF schematic wherein the conductive particles 112 are on the top of the adhesive film 120 and may not be covered completely by the adhesive. Optionally, an additional thin layer of adhesive layer may be over-coated onto the as-transferred particle layer to improve the tackiness of the non-random array ACF film, particularly when the particle concentration is high. An adhesive different from that for the adhesive film 120 may be employed for the overcoating.

The film 100 may further be laminated at the lamination station 180 with a substrate 140 which is optionally precoated with an adhesive, to result in a non-random array ACF 100 sandwiched between two substrates 130 and 140. The adhesion strengths between the adhesive 120 and the two substrates 130 and 140 should be lower than the cohesion strength of the adhesive. To facilitate the sequential peeling of the two substrates from the adhesive during bonding, it is preferable that one of the adhesion strengths is substantially larger than the other.

The adhesives used in the above-mentioned processes may be thermoplastic, thermoset, or their precursors. Useful adhesives include but are limited to pressure sensitive adhesives, hot melt adhesives, heat or radiation curable adhesives. The adhesives may comprise for examples, epoxide, phenolic resin, amine-formaldehyde resin, polybenzoxazine, polyurethane, cyanate esters, acrylics, acrylates, methacrylates, vinyl polymers, rubbers such as poly (styrene-co-butadiene) and their block copolymers, polyolefins, polyesters, unsaturated polyesters, vinyl esters, epoxy resins, phenoxy resins, acrylic resins, polycaprolactone, polyethers, and polyamides. Epoxide, cyanate esters and multifunctional acrylates are particularly useful. Catalysts or curing agents including latent curing agents may be used to control the curing kinetics of the adhesive. Useful curing agents for epoxy resins include, but are not limited to, dicyanodiamide (DICY), adipic dihydrazide, 2-methylimidazole and its encapsulated products such as Novacure HX dispersions in liquid bisphenol A epoxy from Asahi Chemical Industry, amines such as ethylene diamine, diethylene triamine, triethylene tetraamine, BF3 amine adduct, Amicure from Ajinomoto Co., Inc, sulfonium salts such as diaminodiphenylsulphone, p-hydroxyphenyl benzyl methyl sulphonium hexafluoroantimonate. Coupling agents including, but are not limited to, titanate, zirconate and silane coupling agents such as glycidoxypropyl trimethoxysilane and 3-aminopropyl trimethoxy-silane may also be used to improve the durability of the ACF. The effect of curing agents and coupling agents on the performance of epoxy-based ACFs can be found in S. Asai, et al., *J. Appl. Polym. Sci.*, 56, 769 (1995). The entire paper is hereby incorporated by reference in its entirety.

Suitable conductive particles for one embodiment of the present invention are of a narrow particle size distribution with a standard deviation of less than about 10%, preferably, less than about 5%, even more preferably less than about 3%. The particle size is preferably in the range of about 1µ to about 250µ, more preferably about 2µ to about 50µ, even more preferably about 2µ to about 6µ. The size of the microcavities and the conductive particles are selected so that each microcavity has a limited space to contain only one conductive particle. To facilitate particle filling and transferring, a microcavity having a tilted wall with a wider top opening than the bottom may be employed as shown in Liang '700.

Conductive particles comprising a polymeric core and a metallic shell are particularly preferred. Useful polymeric cores include but are not limited to, polystyrene, polyacrylates, polymethacrylates, polyvinyls, epoxy resins, polyurethanes, polyamides, phenolics, polydienes, polyolefins, aminoplastics such as melamine formaldehyde, urea formaldehyde, benzoguanamine formaldehyde and their oligomers, copolymers, blends or composites. If a composite material is used as the core, nano particles or nano tubes of carbon, silica, alumina, BN, $TiO_2$ and clay are preferred as the filler in the core. Suitable materials for the metallic shell include, but are not limited to, Au, Pt, Ag, Cu, Fe, Ni, Sn, Al, Mg and their alloys. Conductive particles having interpenetrating metal shells such as Ni/Au, Ag/Au, or Ni/Ag/Au are particularly useful for optimum hardness, conductivity and corrosion resistance. Particles having rigid spikes such as Ni, carbon, graphite are useful in improving the reliability in connecting electrodes susceptible to corrosion by penetrating into the corrosive film if present.

The narrowly dispersed polymer particles useful for the present invention may be prepared by for example, seed emulsion polymerization as taught in U.S. Pat. Nos. 4,247, 234, 4,877,761, 5,216,065 and Ugelstad swollen particle process as described in Adv., Colloid Interface Sci., 13, 101 (1980); *J. Polym. Sci.,* 72, 225 (1985) and "Future Directions in Polymer Colloids", ed. El-Aasser and Fitch, p. 355 (1987), Martinus Nijhoff Publisher. In one preferred embodiment of the present invention, monodispersed polystyrene latex particle of about 5µ diameter is used as the deformable elastic core. The particle is first treated in methanol under mild agitation to remove excess surfactant and to create microporous surfaces on the polystyrene latex particles. The thus treated particles are then activated in a solution comprising $PdCl_2$, HCl and $SnCl_2$ followed by washing and filtration with water to remove the $Sn^{4+}$ and then immersed in an electroless Ni plating solution (from for example, Surface Technology Inc, Trenton, N.J.) comprising a Ni complex and hydrophosphite at about 90° C. for about 30 minutes to about 50 minutes. The thickness of the Ni plating is controlled by the plating solution concentration and the plating conditions (temperature and time).

The Ni coated latex particle is then placed in an immersion Au plating solution (for example from Enthone Inc.) comprising hydrogen tetrachloroaurate and ethanol at about 90.degree. C. for about 10 minutes to about 30 minutes to form interpenetrating Au/Ni shells having a total metal (Ni+

Au) thickness of about 1μ. The Au/Ni plated latex particles are washed with water and ready for the fluidic filling process. Processes for coating conductive shell on particles by electroless and/or electroplating were taught in for examples, U.S. Pat. No. 6,906,427 (2005), U.S. Pat. No. 6,770,369 (2004), U.S. Pat. No. 5,882,802 (1999), U.S. Pat. No. 4,740, 657 (1988), US Patent Application 20060054867, and *Chem. Mater.*, 11, 2389-2399 (1999).

Fluidic assembly of IC chips or solder balls into recess areas or holes of a substrate or web of a display material has been disclosed in for examples, U.S. Pat. Nos. 6,274,508, 6,281,038, 6,555,408, 6,566,744 and 6,683,663. Filling and top-sealing of electrophoretic or liquid crystal fluids into the microcups of an embossed web were disclosed in for examples, U.S. Pat. Nos. 6,672,921, 6,751,008, 6,784,953, 6,788,452, and 6,833,943. Preparation of abrasive articles having precise spacing by filling into the recesses of an embossed carrier web, an abrasive composite slurry comprising a plurality of abrasive particles dispersed in a hardenable binder precursor was also disclosed in for examples, U.S. Pat. Nos. 5,437,754, 5,820,450 and 5,219,462. All of the aforementioned United States patents are hereby incorporated by reference in their respective entirety. In the above-mentioned art, recesses, holes, or microcups were formed on a substrate by for example, embossing, stamping, or lithographic processes. A variety of materials were then filled into the recesses or holes for various applications including active matrix thin film transistors (AM TFT), ball grid arrays (BGA), electrophoretic and liquid crystal displays.

The invention is illustrated in more detail by the following non-limiting examples.

Example 1

A microcavity film (PIMC) based on Kapton polyimide film VN300 from DuPont was cut at predetermined oblique angle with a tungsten carbide blade. The two PIMC cut side walls are corona treated with a speed of 3 inch/min with a corona-substrate distance of ¼ inch and a power of 40 W. An 1% polyimide adhesion promoter (aminophenyl trimethoxysilane mixed isomera) solution from Gelest was applied to both side walls and dried in air for at least 15 min. The two ends of the PIMC were place on the top of a light box with the microcavity side up. The light box has a smooth and translucent surface to allow a good alignment visually. The two ends were brought together under vacuum to form a loop and the gap of the stitching line was reduced as much as possible, optionally under a microscope. A strip of masking tape such as Ideal 9190 tape was placed on the cavity side of stitching line. A filling material such as Dow Corning SE9187L silicone sealant was applied to stitching gap from the non-cavity side. The gap filling material was cured and the entire stitching area of the non-cavity side was corona treated. A backing film comprising 7.5μ DAP Weldwood Contact Cement (polychlorinated rubber adhesive) on 12.5μ PET film was applied onto the non-cavity side to reinforce the stitching line. The masking tape on the microcavity side was peeled off and the stitched PIMC loop is ready to mount onto the particle filling and transferring stations as schematically shown in FIG. 1.

Example 2

Example 1 was repeated except that the backing film was replaced with a coating of Locktite 5 min instant mixing epoxy. The resulting sample showed strong tensile strength and no change in the gap of the stitching line was observed even when the loop was stretched under a tension of 600-1000 g/in.

Example 3

Example 1 was repeated except that the filling material was changed to a UV curable composition containing 98 wt % of an epoxy functional release coating UV9300 and 2 wt % of a cationic photoinitiator UV9390C (both from Momentive, Columbus. OH). The filled material was cured using a BlueWave® 200 UV spot lamp from Dymax.

Example 4

Example 3 was repeated and a 3M 425 aluminum foil tape (2.8 mil aluminum backing and 1.8 mil acrylic adhesive) was applied to each edge of the stitched loop at the end of the stitching line as shown in FIG. 4. The resulting sample showed strong tensile strength and no change in the gap of the stitching line was observed even when the loop was stretched under a tension of 500-1000 g/in.

Example 5

Figure 9:
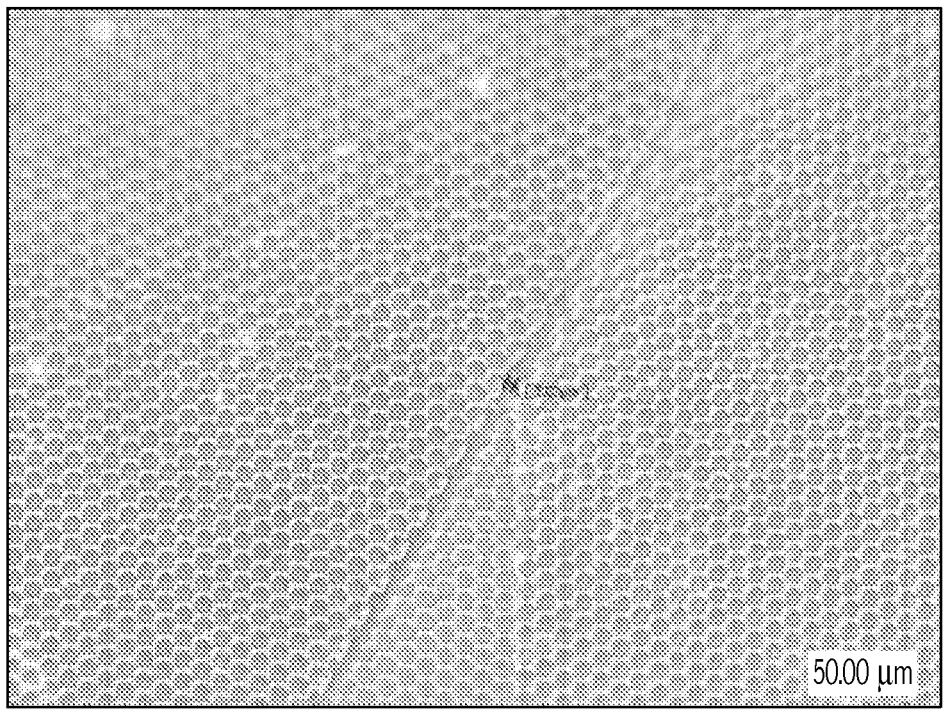
FIG. 9 is a photograph illustrating a 45° angle stitching line of 3μ width filled with an UV curable adhesive and microcavities in a belt in accordance with one embodiment of the invention.

A PIMC film based on Kapton polyimide film VN300 from DuPont was cut at a 60° angle with a tungsten carbide blade. A microcavity loop was made by abutting the two cut ends of microcavity web, and filling the gap with a UV curable composition containing 98 wt % of an epoxy functional release coating UV9300 and 2 wt % of a cationic photoinitiator UV9390C. The filled material was cured using a BlueWave® 200 UV spot lamp from Dymax. An 1 mil polyimide tape P-221 AMB from Nitto Denko K.K was laminated on the non-cavity side to cover the entire area of the stitching line and both edges of the stitched loop were further reinforced with a 3M 425 aluminum foil tape. FIG. 9 is a photograph illustrating microcavities in a loop with a 45° angle stitching line of 3μ width filled with the UV curable composition. The microcavity loop was then mounted onto the particle filling and transferring stations as schematically shown in FIG. 1.

5 parts of conductive particles of a narrow size distribution were dispersed in 95 parts of isopropyl alcohol (IPA) and dispensed onto the microcavity loop using a slot coating die. The particles are filled into the microcavities using a 100% knitted polyester wiper wrapped roller. Excess particles (outside of the microcavity) were carefully removed using a rubber roller. The dimension of the microcavity is selected so that essentially only one conductive particle can be trapped in each microcavity. In this example, 3.2μ diameter Ni/Au particles from Nippon Chemical K.K. were used and the diameter of the microcavity was 5μ.

Example 6

Example 5 was repeated except that the composition of the UV curable filling material was changed to 99 wt % of UV681 (from Permabond, Pottstown, Pa.) and 1 wt % of Ebecryl 350 (from Cytec, Woodland Park, N.J.), and the polyimide back reinforcement tape was changed to 0.5 mil PET substrate precoated with about 0.5 mmil UV curable acrylate 3922 (from Loctite, Westlake, Ohio). Both the filling material and the back reinforcement were cured by a BlueWave® 200 UV spot lamp. The resulting sample showed strong tensile strength and no change in the gap of the stitching line was observed even when the loop was stretched under a tension of 500-100 g/in. The average gap of the stitching line after particle transfer is about 16µ and no conductive particle agglomeration was observed in the entire stitching area.

Example 7

Figure 10:
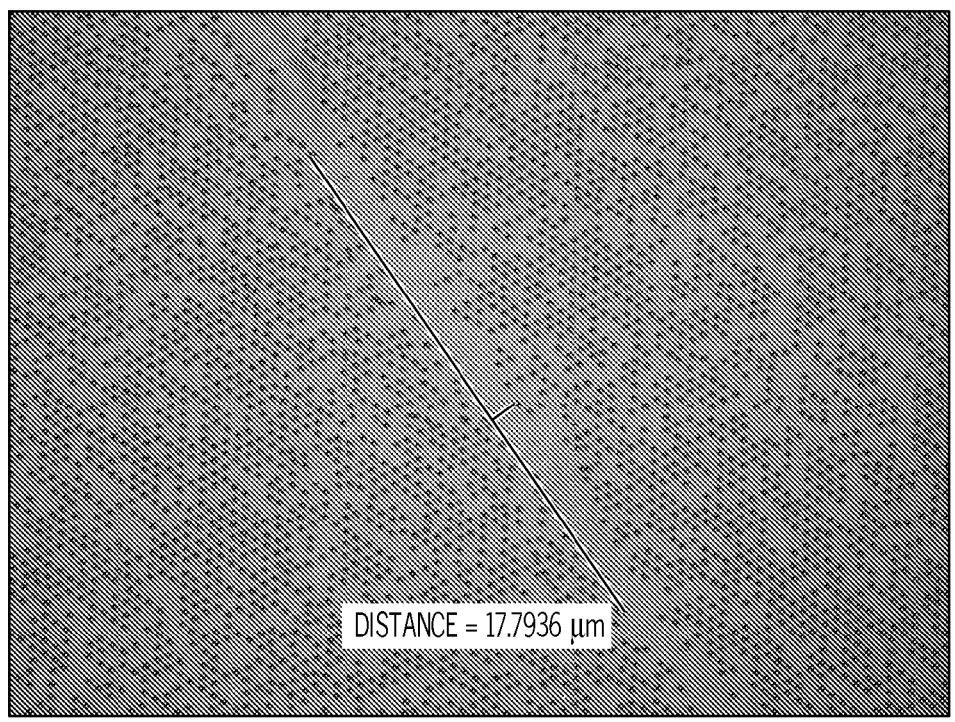
FIG. 10 is a photograph illustrating an ACF with a 45° angle stitching line of about 17μ width, in accordance with another embodiment of the invention.
Figure 11A:
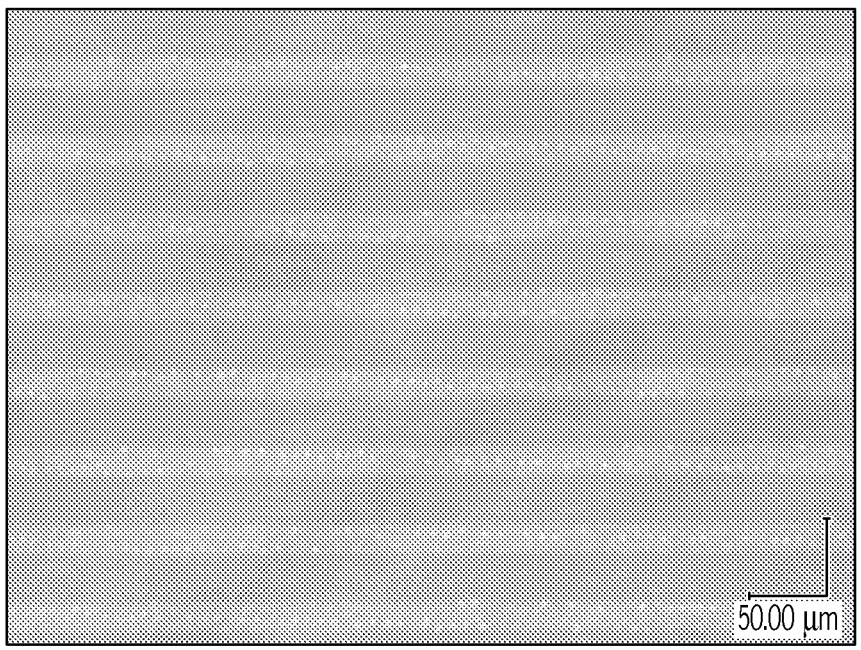
FIGS. 11A and 11B are photographs illustrating electronic devices bonded with an ACF having a 3μ stitching line at a 45° angle (FIG. 11A) in which the stitching line is almost invisible after bonding; and bonded with 50μ stitching line at a 60° angle (FIG. 11B).
Figure 11B:
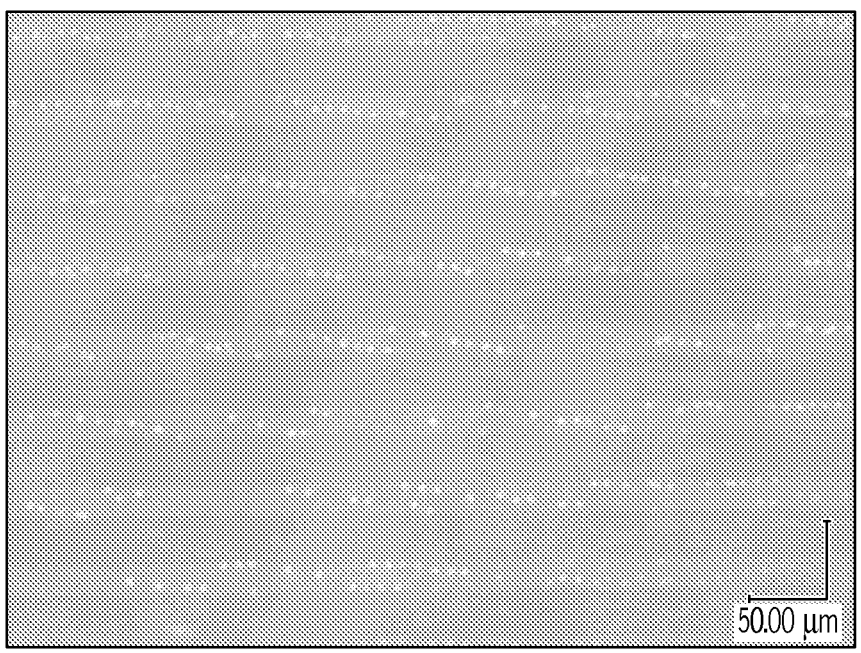

An anisotropic conductive adhesive film comprising a release liner having a release coating capable of being removed under the application of heat and/or pressure, a non-conductive adhesive layer 9 to 18µ thick capable of being softened under the application of heat and/or pressure, and a conductive particle layer on top of non-conductive adhesive layer was formed by laminating with the layer of conductive particles carried on a fixed array pattern PIMC carrier loop belt. The non-conductive adhesive contains resin and hardener which are mixed together through in-line mixing process. Non-conductive adhesive layer is coated from slot die coater at 5 to 10 fpm on in-line corona treated release liner. The adhesive coated film is pre-heated within 20 to 55° C. depending on coating speed before lamination with conductive particles to remove residual solvent. After lamination, conductive particles are embedded in non-conductive adhesive layer and anisotropic conductive adhesive film is formed then this film is passed through post drying oven at temperature of about 75 to 80° C. depended on coating speed to remove the solvent. The anisotropic conductive film and release liner are wound together to form a roll for storage and shipment. FIG. 10 is a photograph illustrating an ACF thus prepared with a 45° angle stitching line of about 17µ width. FIGS. 11A and 11B are photographs illustrating electronic devices bonded with an ACF having a 3µ stitching line at a 45° angle (FIG. 11A) in which the stitching line is almost invisible after bonding; and bonded with 50µ stitching line at a 60° angle (FIG. 11B).

Example 8

Using the method described in Example 7, a non-conductive adhesive coating was coated on a release liner. It was coated using slot die coater then pre-dried and laminated with a fixed array pattern formed by pre-dispensing Au particles on polyimide laser ablated film. After Au particles were transferred through lamination, an anisotropic conductive adhesive film was formed then post dried in an oven to remove solvent, and the film was slit and rewound.

Example 9

Example 7 was repeated and laminated with adhesives coating on a continuous web by a pressure roller. The adhesive coated web is slightly wider than microcavity web and the microcavity web and adhesive coating web were aligned before lamination. For example, the web edge difference between two webs would be less than ⅛ inch if the adhesive coating web is ¼ inch wider than microcavity web. A 3.5 inch wide lamination roller was used for 3.0 inch microcavities on 4.5 inch wide polyimide carrier film with ⅜ inch wide aluminum foil tape on each non-cavity side because the lamination roller's width should be larger than that of microcavity area, but smaller than carrier film minus two side of reinforcement. Web speed, lamination pressure, temperatures on lamination roller and microcavity web, and residue solvent content of adhesive coating immediately before transfer can be adjusted to have greater than 99% transfer efficiency, or almost all filled conductive particles are transferred to the adhesive coating to form an ACF roll. In this case, 7 ft/min web speed, 50 psi lamination pressure and room temperature, 1.5% residue solvent content of adhesive coating were chosen for transfer.

Having described the invention in detail and by reference to specific embodiments thereof it will be apparent that numerous variations and modifications are possible without departing from the spirit and scope of the following claims.

What is claimed is:

1. An anisotropic conductive film (ACF) comprising a plurality of conductive particles disposed in predefined non-random particle locations as a non-random array in or on an adhesive layer, wherein the ACF includes an oblique area that is essentially free from conductive particles that corresponds to an oblique line that runs across the ACF; wherein the ACF has an X-Y plane corresponding to its length and width and a Z-axis corresponding to its thickness and the ACF is insulating in the X-Y plane relative to the Z-axis which is conductive.

2. The ACF of claim 1 wherein said conductive particles are partially buried in the adhesive layer.

3. The ACF of claim 1 wherein the ACF is made by a method comprising: distributing a plurality of conductive particles into an array of microcavities formed on a surface of a continuous carrier belt, rotating the belt carrying the conductive particles while conveying a surface of an adhesive layer into contact with the surface of the rotating belt, transferring the conductive particles from the microcavities on the belt to the adhesive layer in predefined locations in the adhesive layer corresponding to the array of microcavities on the belt, and separating the adhesive layer from the surface of the belt, wherein the belt is a closed loop including a stitching line that runs across the belt from one edge of the belt to the opposite edge at an angle that is oblique with respect to the edges of the belt.

4. The ACF of claim 3 wherein the oblique line is at an angle of about 30 to 80°.

5. The ACF of claim 4 wherein the oblique line is at an angle of about 35 to 60°.

6. The ACF of claim 1 wherein the oblique line is less than about 100µ wide.

7. The ACF of claim 6 wherein the oblique line is less than about 20µ wide.

8. The ACF of claim 1 wherein the adhesive comprises an acrylic, epoxy or phenoxy resin.

* * * * *